US006380017B1

(12) United States Patent
Darwish et al.

(10) Patent No.: US 6,380,017 B1
(45) Date of Patent: Apr. 30, 2002

(54) POLYSILICON-EDGE, BASE-EMITTER SUPER SELF-ALIGNED, LOW-POWER, HIGH-FREQUENCY BIPOLAR TRANSISTOR AND METHOD OF FORMING THE TRANSISTOR

(75) Inventors: Mohamed N. Darwish, Campbell; Alexei Sadovnikov; Reda Razouk, both of Sunnyvale, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/882,859

(22) Filed: Jun. 15, 2001

(51) Int. Cl.⁷ .......................................... H01L 21/8238
(52) U.S. Cl. ...................................... 438/202; 257/565
(58) Field of Search ................................ 438/202–208; 257/525, 526, 565, 592, 593

(56) References Cited

U.S. PATENT DOCUMENTS 5,523,244 A * 6/1996 Vu et al. ...................... 437/31
5,721,147 A * 2/1998 Yoon ............................ 437/31

OTHER PUBLICATIONS

C.A. King et al., "Very Low Cost Graded SiGe Base Bipolar Transistors for a High–Performance Modular BiCMOS Process", IEDM, 1999, pp. 565–568.

Wim van der Wel et al., "Poly–Ridge Emitter Transistor (PRET): Simple Low–Power Option to a Bipolar Process", IEDM, 1993, pp. 453–456.

* cited by examiner

Primary Examiner—David Nelms
Assistant Examiner—Quoc Hoang
(74) Attorney, Agent, or Firm—Pillsbury Winthrop LLP

(57) ABSTRACT

A low-power high-frequency bipolar transistor is formed to have a small self-aligned intrinsic base region, and small self-aligned extrinsic base and emitter regions that contact the intrinsic base region. The small regions reduce the base resistance, the base-to-collector capacitance, and the base-to-emitter capacitance.

19 Claims, 5 Drawing Sheets

POLYSILICON-EDGE, BASE-EMITTER SUPER SELF-ALIGNED, LOW-POWER, HIGH-FREQUENCY BIPOLAR TRANSISTOR AND METHOD OF FORMING THE TRANSISTOR

BACKGROUND OF THE INVENTION

1. Field of the Invention

The present invention relates to a bipolar transistor and, more particularly, to a polysilicon-edge, base-emitter super self-aligned, low-power, high-frequency bipolar transistor and a method of forming the transistor.

2. Description of the Related Art

A high-frequency bipolar transistor is a device that can turn off and on again fast enough to respond to a high-frequency signal without distorting the wave shape of the signal. A low-power high-frequency bipolar transistor is a device that consumes very little power in responding to the high-frequency signal. Low-power high-frequency bipolar transistors are used in wireless applications, and are finding uses in emerging optical networking applications.

FIG. 1 shows a cross-sectional diagram that illustrates a portion of a prior-art, low-power high-frequency bipolar transistor 100. As shown in FIG. 1, transistor 100 includes a collector layer 110, a base layer 112 that is formed on collector layer 110, and a field oxide region FOX that adjoins layer 112. In addition, transistor 100 includes a thin oxide layer 114 that is formed on a portion of base layer 112 and the field oxide region FOX, and a n+ extrinsic emitter 116 that is formed on thin oxide layer 114.

As further shown in FIG. 1, transistor 100 also includes an n+ emitter region 118 that is formed in base layer 112, and an n+ poly ridge 120 that is connected to extrinsic emitter 116 and n+ emitter region 118. Extrinsic emitter 116, emitter region 118, and poly ridge 120 form the emitter of the transistor.

Transistor 100 additionally includes a silicided base contact 122 that is formed on base layer 112, and a silicided emitter contact 124 that is formed on extrinsic emitter 116. In addition, an oxide spacer 126 is formed on base layer 112 between poly ridge 120 and base contact 122.

During fabrication, emitter region 118 is formed from dopants diffusing from poly ridge 120 into base layer 112. As a result, a very small base-to-emitter junction results. A small base-to-emitter junction reduces the base-to-emitter capacitance. Reduced capacitance, in turn, provides low-power high-frequency operation.

One drawback of transistor 100, however, is that transistor 100 has a large base-to-collector capacitance which, in turn, limits the operation of the transistor. Thus, there is a need for a low-power high-frequency bipolar transistor with a reduced base-to-emitter capacitance and base-to-collector capacitance.

SUMMARY OF THE INVENTION

The present invention provides a low-power high-frequency bipolar transistor that reduces the base resistance, the base-to-emitter capacitance, and the base-to-collector capacitance. The bipolar transistor of the present invention is formed on a wafer that has a buried layer and a first epitaxial layer of a first conductivity type. The first epitaxial layer is formed over the buried layer, and has a smaller dopant concentration than the buried layer.

The bipolar transistor has an intrinsic base region of a second conductivity type that is formed on the surface of the first epitaxial layer in the opening. The bipolar transistor also has a layer of isolation material that is formed on the surface of the first epitaxial layer to adjoin the intrinsic base region.

In addition, the bipolar transistor has a first spacer that is formed on the layer of isolation material and the intrinsic base region, and a second spacer that is formed on the layer of isolation material and the intrinsic base region. The second spacer is spaced apart from the first spacer. The transistor further includes an extrinsic base that is formed on the layer of isolation material, an intrinsic emitter region that is formed in the intrinsic base region, and an extrinsic emitter that is formed on the layer of isolation material.

The bipolar transistor also includes a first conductive spacer that is formed on the first isolating spacer to contact the extrinsic base and the intrinsic base region, and a second conductive spacer that is formed on the second isolating spacer to contact the extrinsic emitter and the intrinsic emitter region of the intrinsic base region. The second conductive spacer is spaced apart from the first conductive spacer.

The present invention also includes a method for forming a low-power high-frequency bipolar transistor. The bipolar transistor is formed on a wafer that has a buried layer and a first epitaxial layer of a first conductivity type. The first epitaxial layer is formed over the buried layer and has a smaller dopant concentration than the buried layer.

The bipolar transistor additionally has an intrinsic base region of a second conductivity type that is formed on only a portion of the first epitaxial layer, and a layer of isolation material that contacts the first epitaxial layer and the intrinsic base region. The bipolar transistor further has an extrinsic base that is formed on the layer of isolation material, and an extrinsic emitter spaced apart from the extrinsic base that is formed on the layer of isolation material. The bipolar transistor additionally has a base spacer that is connected to the intrinsic base and the extrinsic base, and an emitter spacer that is connected to the intrinsic base and the extrinsic emitter.

The present invention also includes a method for forming a low-power high-frequency bipolar transistor. The bipolar transistor is formed on a wafer that has a buried layer and a first epitaxial layer of a first conductivity type. The first epitaxial layer is formed over the buried layer and has a smaller dopant concentration than the buried layer.

The method of the present invention begins by forming a layer of isolation material on the first epitaxial layer, and forming an extrinsic base and an extrinsic emitter on the layer of isolation material. The extrinsic base, which is spaced apart from the extrinsic emitter, has a second conductivity type while the extrinsic emitter has the first conductivity type.

The method also includes the step of etching the layer of isolation material to form a first opening in the layer of isolation material. The first opening is between the extrinsic base and the extrinsic emitter, and exposes a surface of the first epitaxial layer. The method further includes the step of forming an intrinsic base region on the first epitaxial layer in the first opening.

The method additionally includes the step of forming a first insulating spacer, a second insulating spacer, and an insulating plug on the intrinsic base region in the first opening. The first insulating spacer contacts the extrinsic base, the second insulating spacer is spaced apart from the first insulating spacer and contacts the extrinsic emitter. The insulating plug is spaced apart from the first and second insulating spacers, and formed between the first and second insulating spacers.

Further, the method includes the step of forming a base spacer that contacts the extrinsic base and the intrinsic base between the first insulating spacer and the insulating plug, and an emitter spacer that contacts the extrinsic emitter and the intrinsic base between the second insulating spacer and the insulating plug.

A better understanding of the features and advantages of the present invention will be obtained by reference to the following detailed description and accompanying drawings that set forth an illustrative embodiment in which the principles of the invention are utilized.

DETAILED DESCRIPTION

Figure 1:
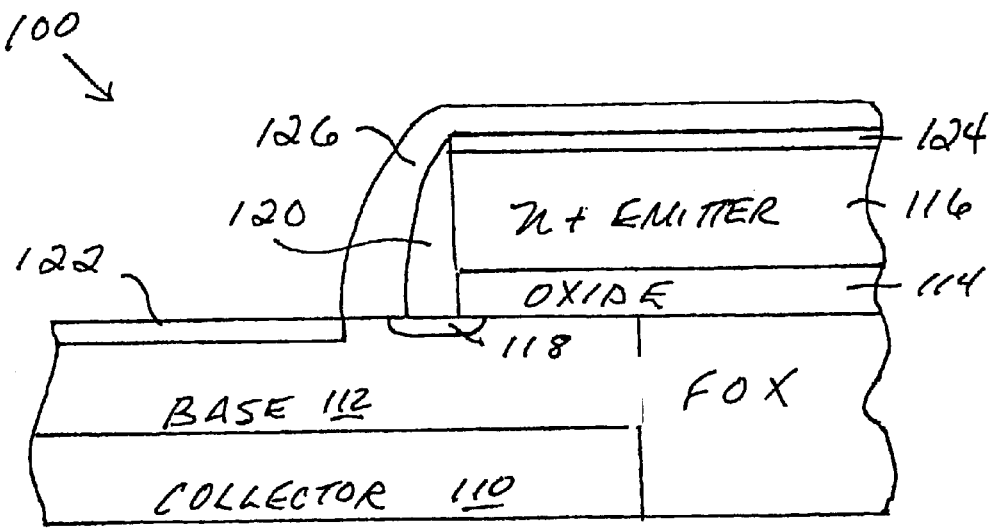
FIG. 1 is a cross-sectional diagram illustrating a portion of a prior-art, low-power high-frequency bipolar transistor 100.
Figure 2:
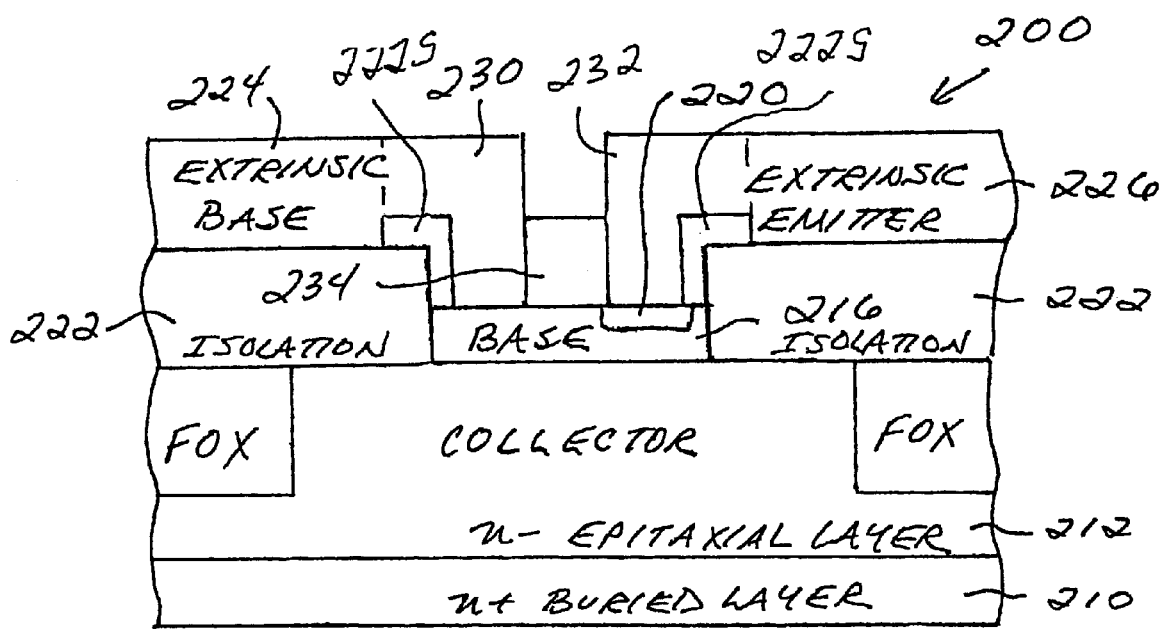
FIG. 2 is a cross-sectional diagram illustrating a portion of a low-power high-frequency bipolar transistor 200 in accordance with the present invention.

FIG. 2 is a cross-sectional diagram that illustrates a portion of a low-power high-frequency bipolar transistor 200 in accordance with the present invention. As shown in FIG. 2, transistor 200 is formed on a wafer that has an n+ buried layer 210, an n− epitaxial layer 212 that is formed over n+ buried layer 210, and a field oxide region FOX that adjoins layer 212. N+ buried layer 210 and n− epitaxial layer 212 form the collector of transistor 200.

As further shown in FIG. 2, transistor 200 includes a p− intrinsic base 216 that is formed on n− epitaxial layer 212. In accordance with the present invention, intrinsic base 216 is formed to have a predefined footprint that is at or near the minimum photolithographic limits of the fabrication process. Minimizing the size of base 216 minimizes the base-to-collector contact area which, in turn, reduces the base-to-collector capacitance. For example, using 0.2 um design rules, a base-to-collector area of 0.06 um$^2$ can be achieved.

In addition, transistor 200 includes an n+ intrinsic emitter region 220 that is formed in p− intrinsic base 216, and a layer of isolation material 222 that is formed on n− epitaxial layer 212 to adjoin intrinsic base 216. In addition, an isolation spacer 222S is also formed on isolation layer 222 and intrinsic base 216.

Transistor 200 further includes an extrinsic base 224 that is formed on isolation layer 222, isolation spacer 222S, and an extrinsic emitter 226 that is spaced-apart from base 224 and formed on isolation layer 222. Transistor 200 additionally has a base spacer 230 that is connected to intrinsic base 216 and extrinsic base 224, and a spaced-apart emitter spacer 232 that is connected to intrinsic emitter region 220 and extrinsic emitter 226.

As described in greater detail below, the method of the present invention forms spacers 230 and 232 in a self-aligned process that produces sublithographic feature sizes. This allows emitter region 220 to be very small which, in turn, reduces the base-to-emitter capacitance. Further, the close spacing between the base and emitter spacers 230 and 232 reduces the base resistance. As further described in greater detail below, the method of the present invention also utilizes isolation spacers 222S to position emitter region 220 away from the junction between intrinsic base 216 and isolation layer 222.

Figure 3A:
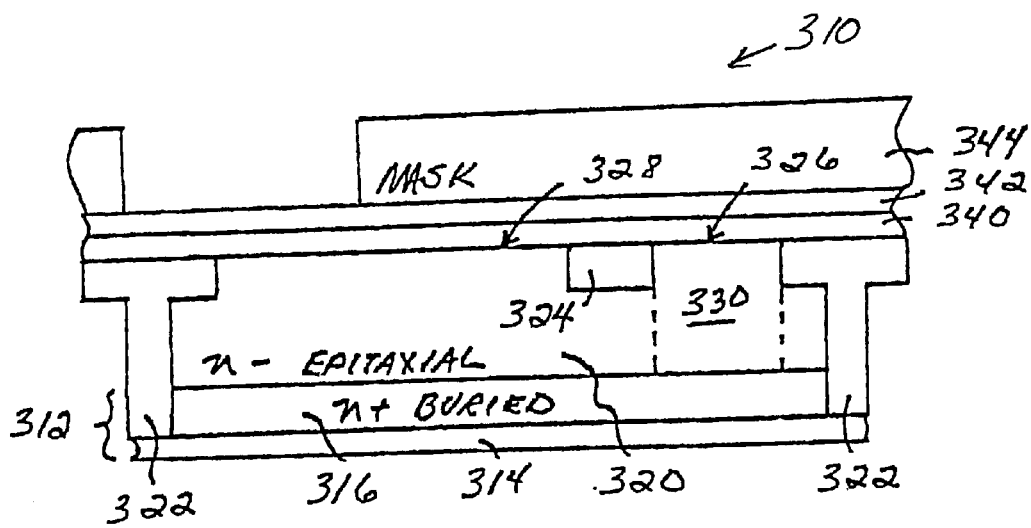
FIGS. 3A–3K are cross-sectional drawings illustrating a method of forming a bipolar transistor in accordance with the present invention.

FIGS. 3A–3K are cross-sectional drawings that illustrate a method of forming bipolar transistor 200 in accordance with the present invention. As shown in FIG. 3A, the method utilizes a conventionally-formed wafer 310 that has a semiconductor layer 312. Semiconductor layer 312, in turn, has a substrate layer 314, such as silicon or oxide, and an n+ buried layer 316. In addition, wafer 310 also has a lightly-doped, n-type epitaxial layer 320 that is formed on n+ buried layer 316.

Wafer 310 further has a deep trench isolation region 322 that isolates epitaxial layer 320 from laterally adjacent regions. A shallow trench isolation region 324 is also formed in epitaxial layer 320. The shallow trench isolation region 324 separates a collector surface area 326 from a base/emitter surface area 328 of the to-be-formed bipolar transistor.

In addition, wafer 310 can optionally include an n+ diffused contact region 330 that extends down from collector surface area 326 in epitaxial layer 320 to contact n+ buried layer 316. Contact region 330 is utilized to reduce the series resistance to buried layer 316. N+ buried layer 316, n− epitaxial layer 320, and optional n+ diffused contact region 330 define the collector of the to-be-formed bipolar transistor.

As shown in FIG. 3A, the method of the present invention begins by depositing a layer of oxide 340 approximately 2000Å thick on the surface of epitaxial layer 320. Following this, a layer of undoped polysilicon (poly) 342 approximately 2000Å thick is deposited on oxide layer 340. Next, a first poly-doping mask 344 is formed and patterned on poly layer 342.

Mask 344 is patterned to expose an extrinsic emitter region of poly layer 342, and protect an extrinsic base region of poly layer 342. Once mask 344 has been patterned, the exposed regions of poly layer 342 are implanted with a dopant, such as phosphorous or arsenic, to dope the extrinsic emitter region of poly layer 342. For example, phosphorous can be implanted into poly layer 342 at a dose of $1.0\times10^{16}$ atoms/cm$^3$ at an implant energy of 30 KeV. Mask 344 is then stripped.

Following this, a second poly-doping mask (not shown) is formed and patterned on poly layer 342. The second poly-doping mask is patterned to protect the extrinsic emitter region of poly layer 342, and expose the extrinsic base region of poly layer 342. Once the second poly-doping mask has been patterned, the exposed regions of poly layer 342 are implanted with boron to dope the extrinsic base region of poly layer 342. For example, boron can be implanted at a dose of $1.0\times10^{16}$ atoms/cm$^3$ at an implant energy of 15 KeV. The second poly-doping mask is then stripped.

Figure 3B:
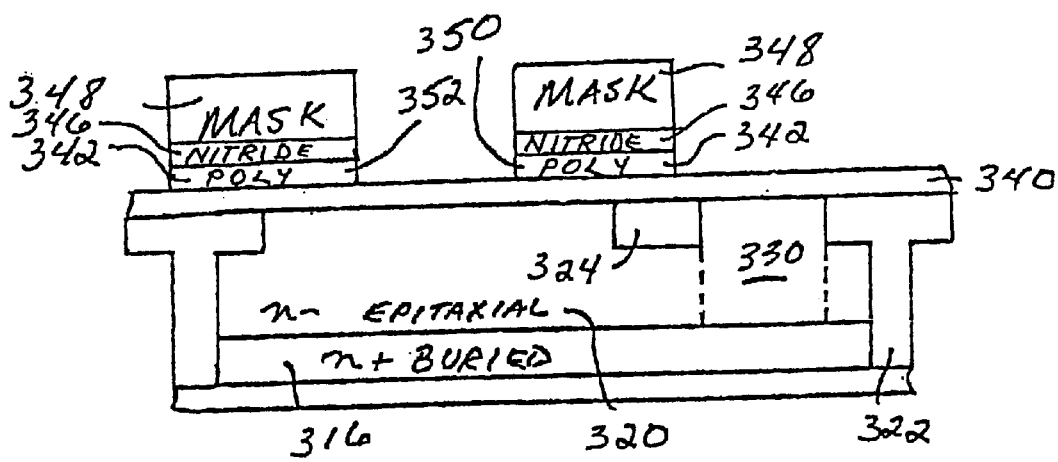

Next, as shown in FIG. 3B, a poly etch mask 348 is formed and patterned on poly layer 342. Mask 348 is patterned to protect the extrinsic base and emitter regions of poly layer 342. Once mask 348 has been patterned, the exposed region of poly layer 342 is etched and removed. The etch defines an extrinsic base 350 and an extrinsic emitter 352. Mask 348 is then stripped.

Figure 3C:
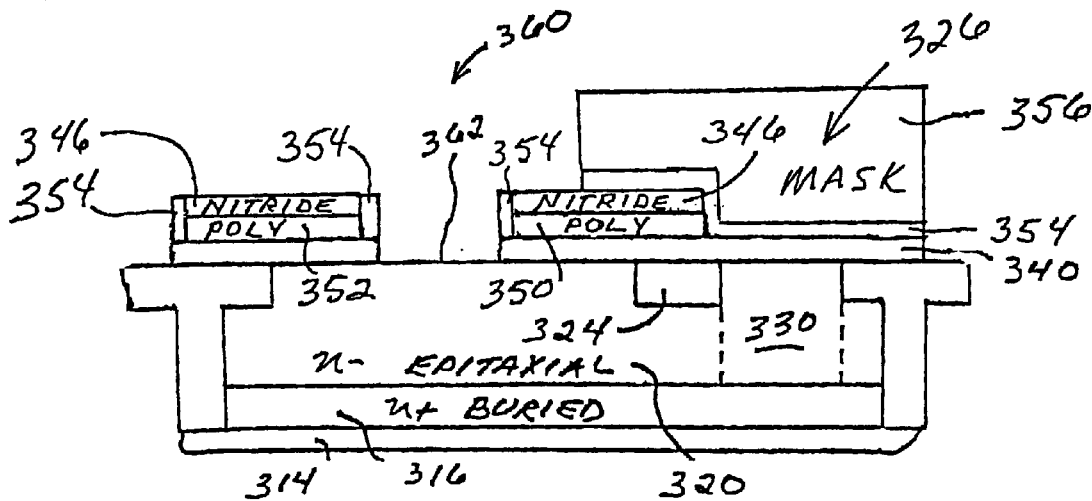

Following this, as shown in FIG. 3C, a layer of silicon nitride 354 approximately 100Å thick is formed on the exposed surfaces of oxide layer 340, nitride layer 346, extrinsic base 350, and extrinsic emitter 352. Nitride layer 354 protects extrinsic base 350 and extrinsic emitter 352 during a subsequent epitaxial growth step. After nitride layer 354 has been formed, an oxide mat definition mask 356 is formed and patterned on nitride layer 354. Mask 356 is patterned to expose a base region of nitride layer 354.

Once mask 356 has been patterned, the exposed region of nitride layer 354 and the underlying oxide layer 340 are dry etched and removed. The etch forms an opening 360 that exposes a surface region 362 of n− epitaxial layer 320. Opening 360 can be, for example, approximately 0.3 um square. The etch also removes nitride layer 354 from a portion of the top surface of base 350 and all of the top surface of extrinsic emitter 352. Mask 356 is then stripped.

Figure 3D:
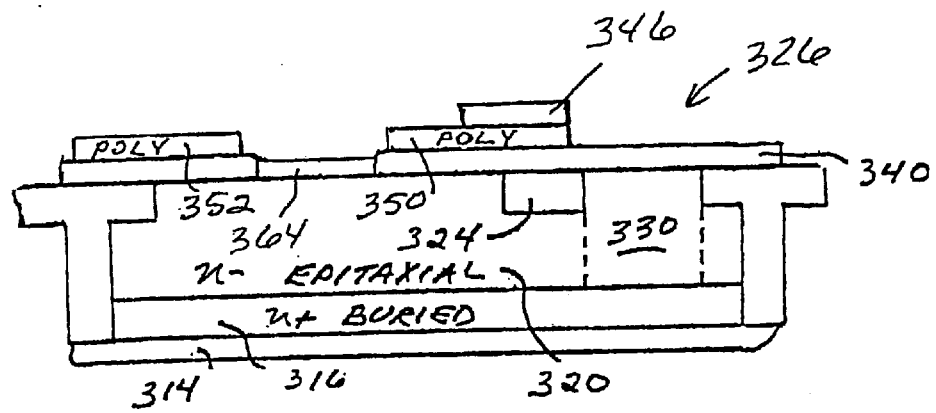

As shown in FIG. 3D, once mask 356 has been stripped, a p− intrinsic base 364 approximately 1000Å thick is formed on n− epitaxial layer 320. P− intrinsic base 364 can be formed by growing a p− epitaxial layer using conventional epitaxial preparation and growth steps. Germanium or germanium carbon can be added to the silicon used to epitaxially form base 364 to enhance the performance of the to-be-formed bipolar transistor.

Alternately, rather than forming intrinsic base 364 by growing a p− epitaxial layer, intrinsic base 364 can be formed by implanting n− epitaxial layer 320 with boron. Thus, in accordance with the present invention, the size of opening 360 defines the size of intrinsic base 364. By forming intrinsic base 364 to have a small size, the base-to-collector capacitance is reduced.

After p− intrinsic base 364 has been formed, nitride layer 354 is wet (isotropically) etched to expose the side walls of extrinsic base 350 and extrinsic emitter 352. In addition to removing nitride layer 354 from the side walls of extrinsic base 350 and extrinsic emitter 352, the etch also removes nitride layer 354 from the top surface of extrinsic base 350 and collector surface area 326. Further, the etch removes the exposed regions of nitride layer 346 from extrinsic base 350, and all of nitride layer 346 from extrinsic base 350. The etch leaves a portion of nitride layer 346 on the surface of extrinsic base 350.

Figure 3E:
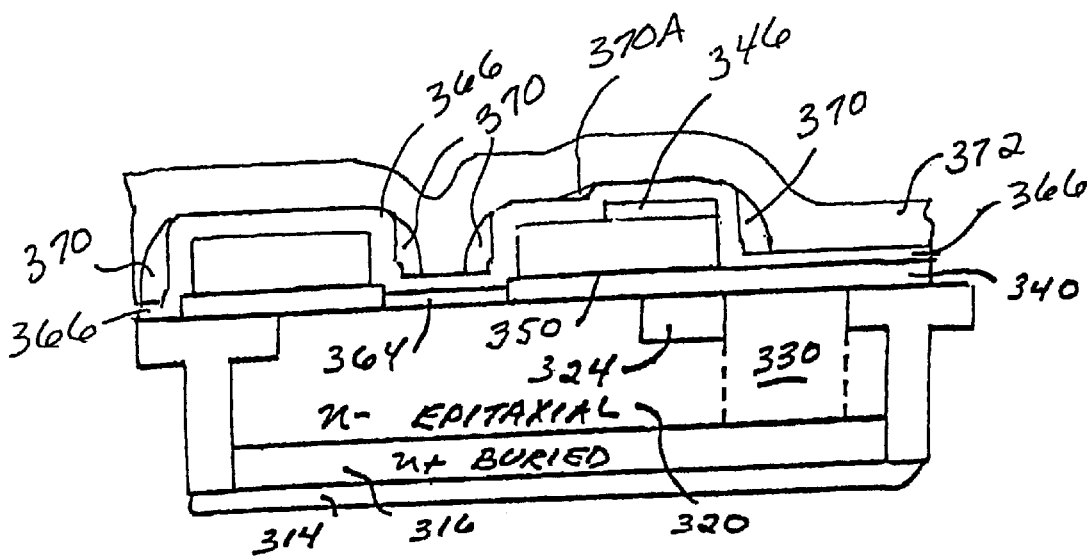

Following this, as shown in FIG. 3E, a layer of seal oxide 366 approximately 500Å thick is formed on oxide layer 340, nitride layer 346, extrinsic base 350, extrinsic emitter 352, and intrinsic base 364. Following this, a layer of silicon nitride approximately 1000Å thick is formed on seal oxide layer 366.

The layer of silicon nitride is then anisotropically etched to form nitride side wall spacers 370 and a nitride stringer 370A. (The thickness of the silicon nitride layer defines the width of spacers 370 which, in turn, define the width of the to-be-formed emitter.) Next, a layer of plug oxide 372 approximately 1500Å thick is formed on seal oxide layer 366, nitride side wall spacers 370, and nitride stringer 370A.

Plug oxide 372 can be implemented, for example, with HDP or TEOS (depo/etch/depo/etch). Filling the gap between spacers 370 over intrinsic base 364 with plug oxide layer 372 is critical. The thickness of plug oxide layer 372 defines the amount of to-be-performed planarizing that must be done.

Figure 3F:
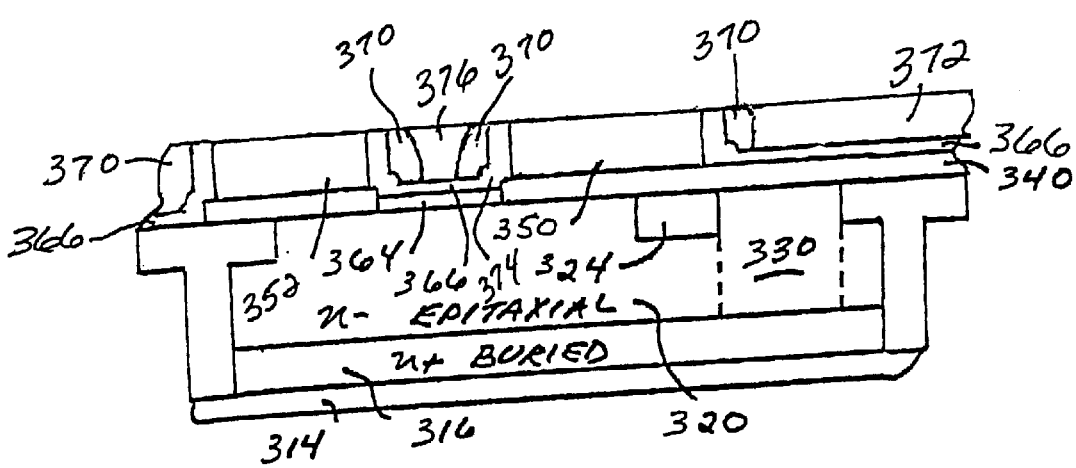

As shown in FIG. 3F, wafer 310 is next planarized, such as by chemical mechanical polishing (CMP), until seal oxide layer 366 is removed from the surfaces of extrinsic base 350 and extrinsic emitter 352. The planarization also removes nitride layer 346 from over extrinsic base 350, the tops of nitride side wall spacers 370, and nitride stringer 370A. In addition, the planarization forms an oxide plug 376 between spacers 370. The planarization must expose side wall spacers 370. As a result, a portion of the top surfaces of extrinsic base 350 and extrinsic emitter 352 may need to be removed as well.

Figure 3G:
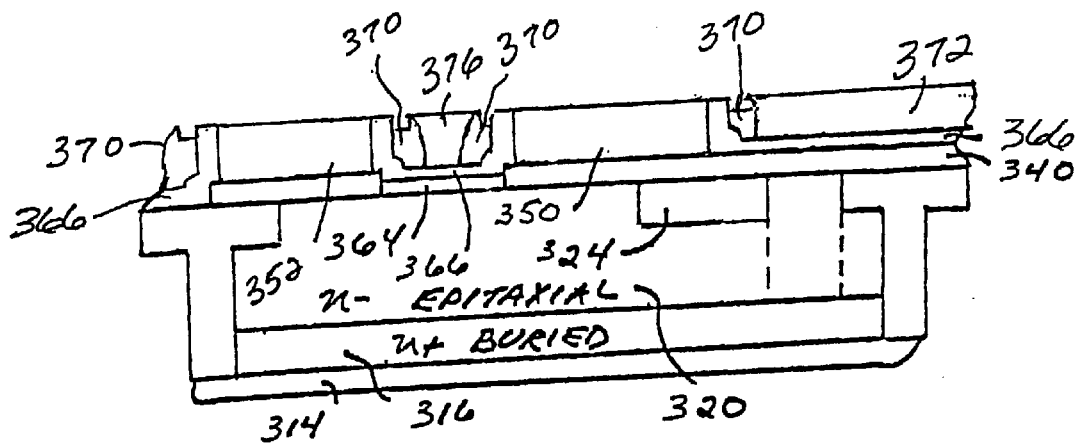

Following this, as shown in FIG. 3G, nitride side wall spacers 370 are etched with a timed dry (anisotropic) etch to remove approximately ¼ of the height of nitride side wall spacers 370. The etch must expose the top portion of seal oxide layer 366 that adjoins the side wall of extrinsic base 350 and extrinsic emitter 352. The etch is utilized to subsequently expose the side walls of base 350 and emitter 352, and to keep oxide plug 376 sufficiently high.

Figure 3H:
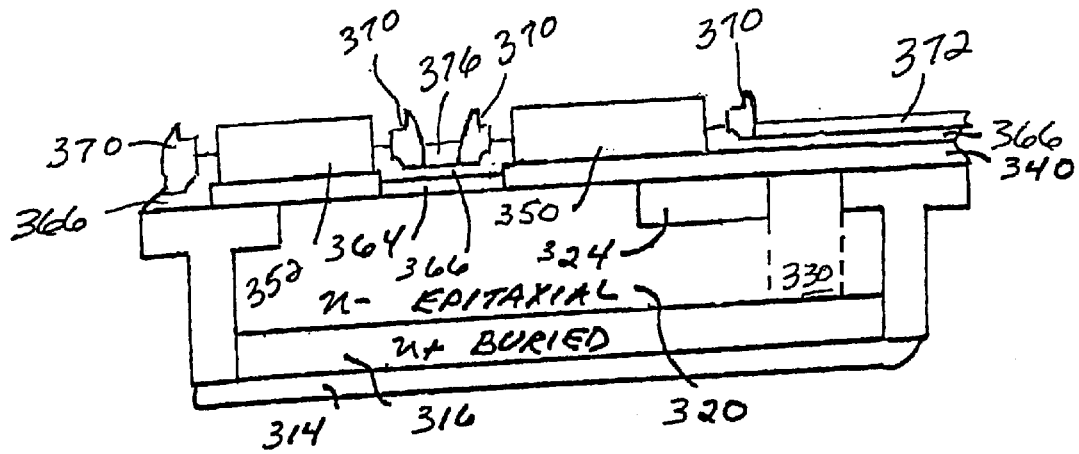
Figure 3I:
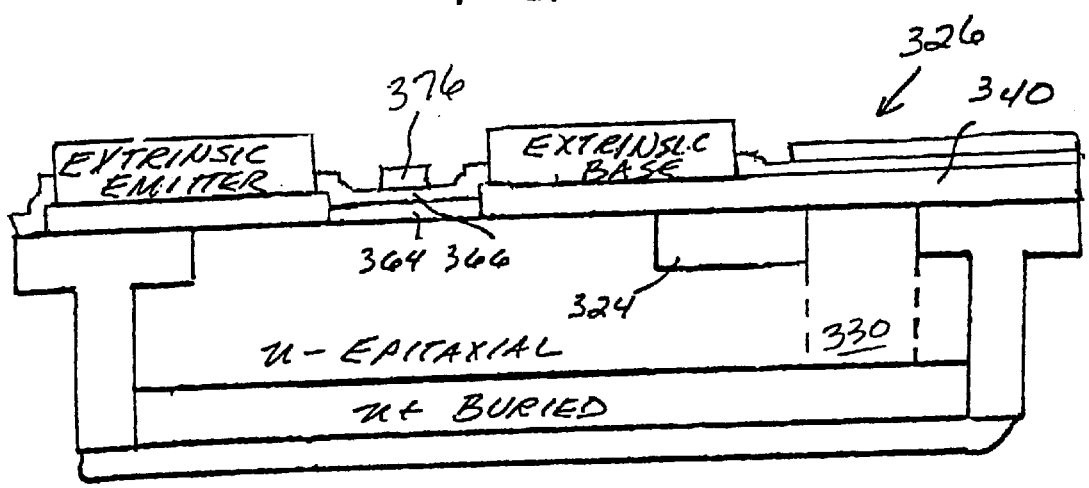
Figure 3J:
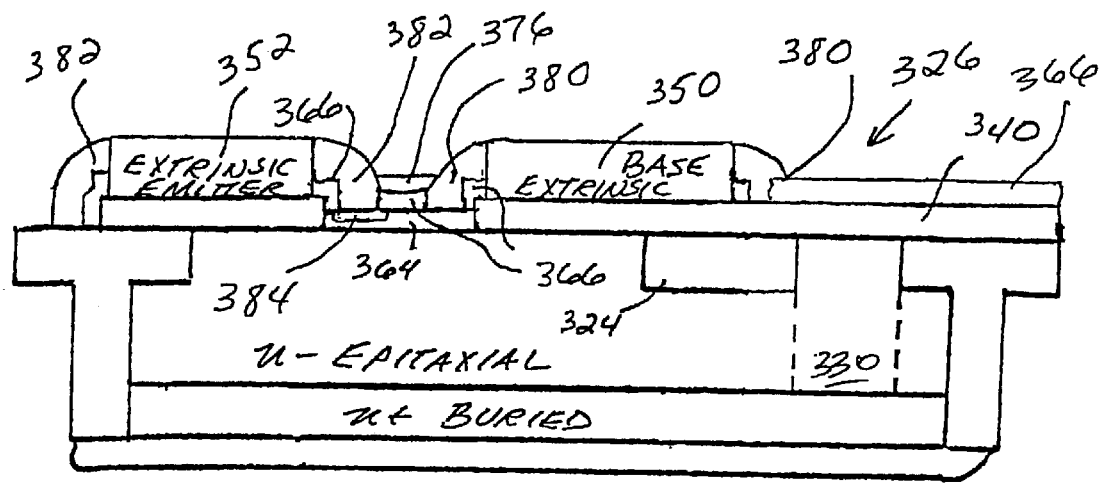

As shown in FIG. 3H, seal oxide layer 366 and oxide plug 376 are next wet (isotropically) etched until about ½ of the side walls of extrinsic base 350 and extrinsic emitter 352 are exposed. After this, as shown in FIG. 3I, nitride side wall spacers 370 are wet etched away. Once nitride side wall spacers 370 have been removed, as shown in FIG. 3J, seal oxide layer 366 is dry (anisotropically) etched to expose p− intrinsic base 364. The etch also reduces the height of oxide layer 366 on the side walls of base 350 and emitter 352, and oxide plug 376.

In accordance with the present invention, oxide spacers 366 on the side walls of base 350 and emitter 352 are utilized to position the to-be-formed intrinsic emitter region away from the junction between oxide layer 340 and base region 364. When base region 364 is formed by epitaxial growth, the quality of the epitaxial layer that adjoins oxide layer 340 is typically poor. By positioning the to-be-formed intrinsic emitter region away from the base-to-oxide junction, the influence of the poor quality material is reduced.

Following this, an undoped layer of poly is deposited on oxide layer 340, extrinsic base 350, extrinsic emitter 352, oxide (side wall) layer 366, and oxide plug 376. The undoped layer of poly is then anisotropically etched to form a base poly spacer 380 that is connected to extrinsic base 350 and intrinsic base 364, and an emitter poly spacer 382 that is connected to extrinsic emitter 352 and intrinsic base 364. Thus, in accordance with the present invention, base and emitter spacers 380 and 382 are self-aligned and formed to have sublithographic feature sizes.

Following the formation of base and emitter spacers 380 and 382, wafer 310 is subject to rapid thermal annealing (RTA). During the RTA process, dopants from extrinsic base 350 diffuse into base poly spacer 380 and into p− intrinsic base 364 to form a contact region in layer 364. At the same time, dopants from extrinsic emitter 352 diffuse into emitter poly spacer 382 and into p− intrinsic base 364 to form an n+ intrinsic emitter region 384 in intrinsic base 364. (Although very little diffusion takes place in single-crystal silicon during an RTA process, significant diffusion takes place in polysilicon.)

Figure 3K:
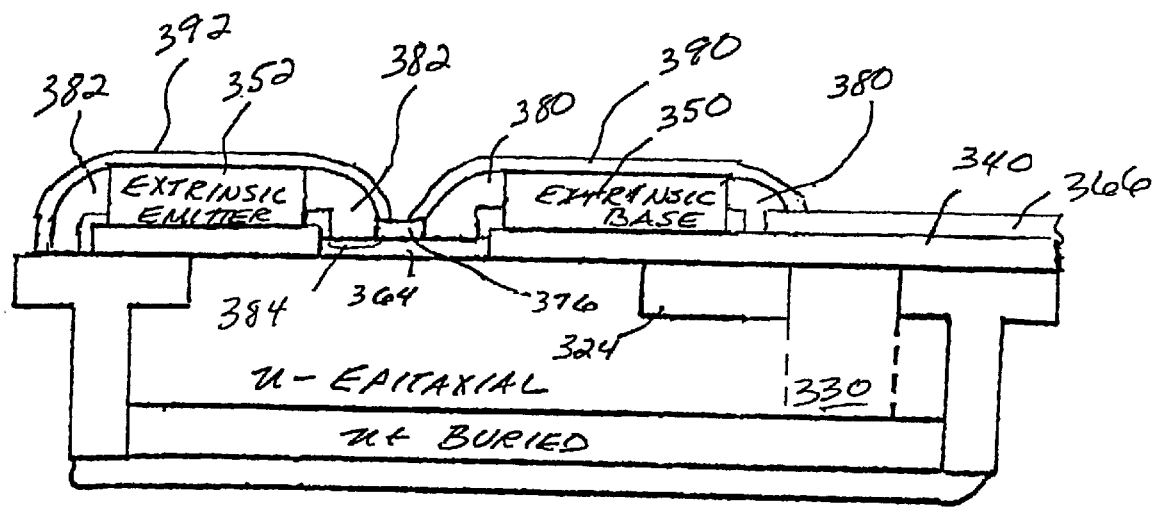
Figure 1:
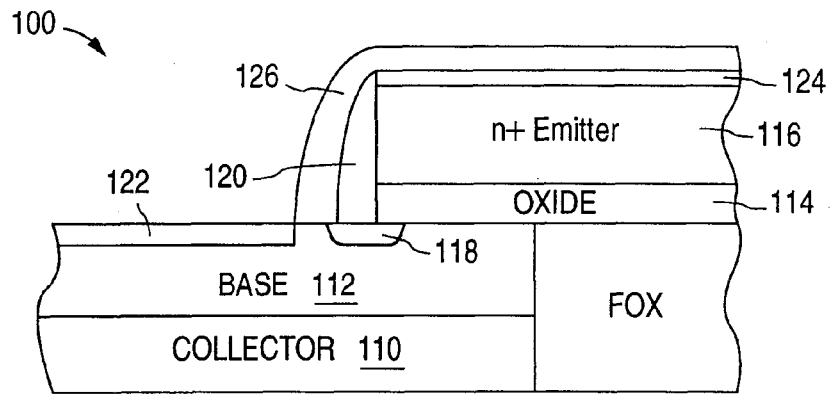
Figure 2:
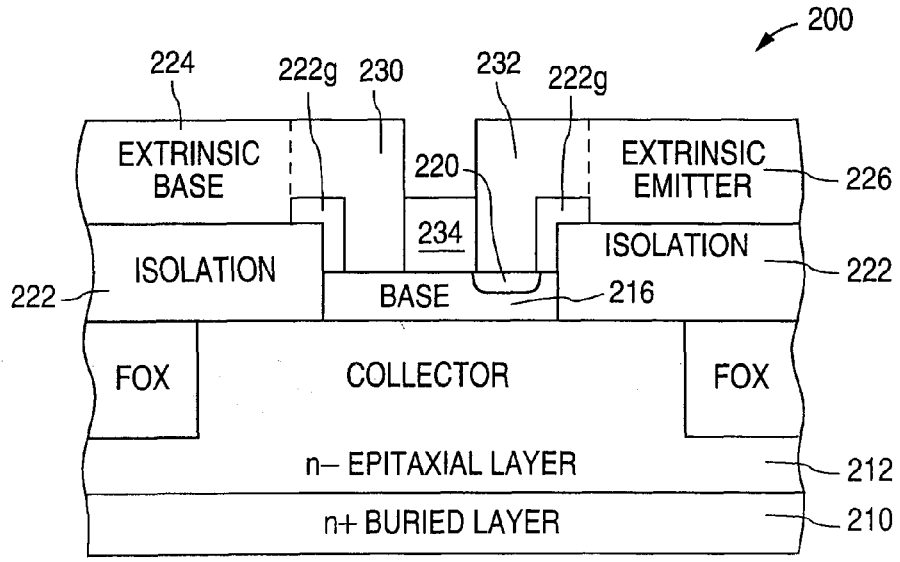
Figure 3A:
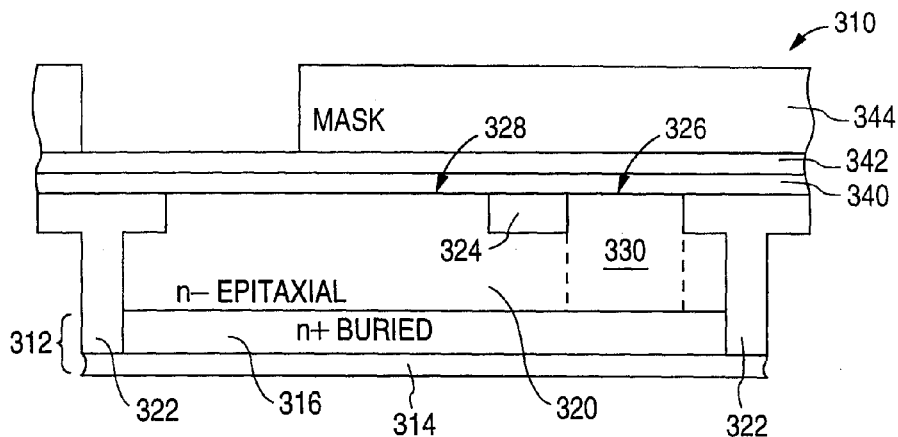
Figure 3B:
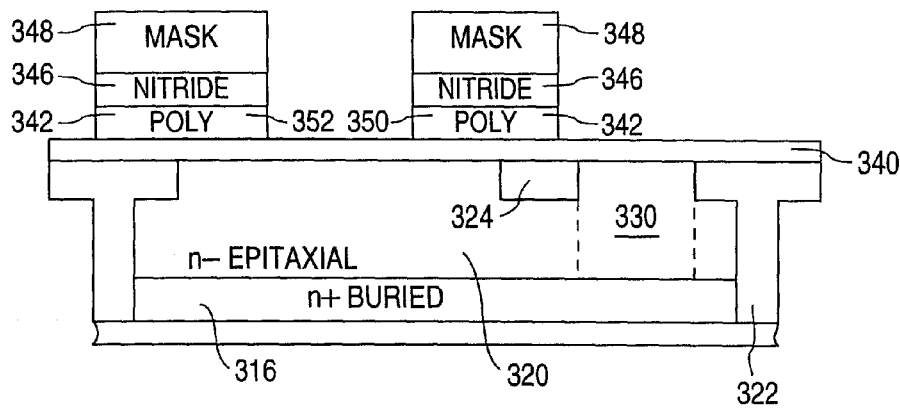
Figure 3C:
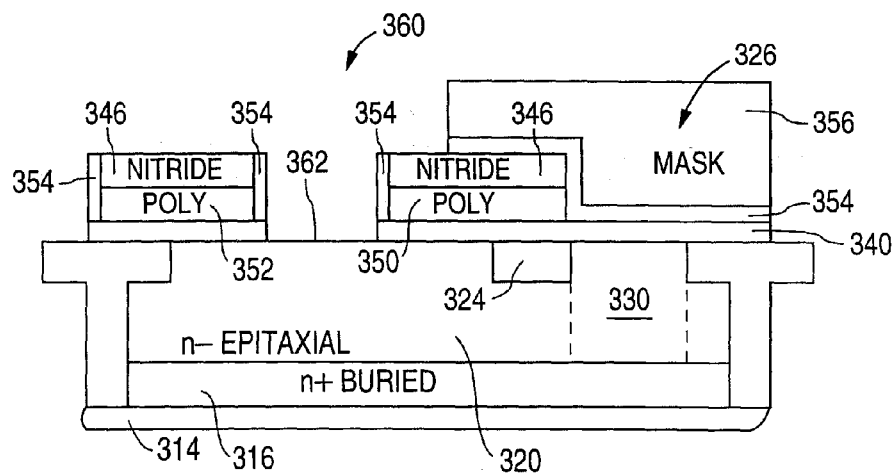
Figure 3D:
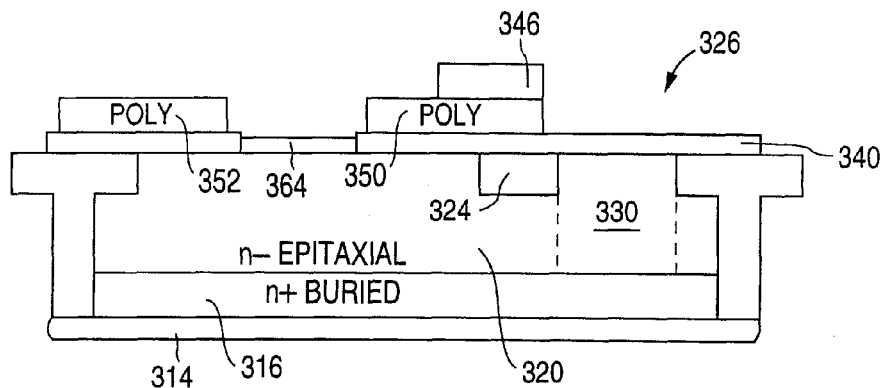
Figure 3E:
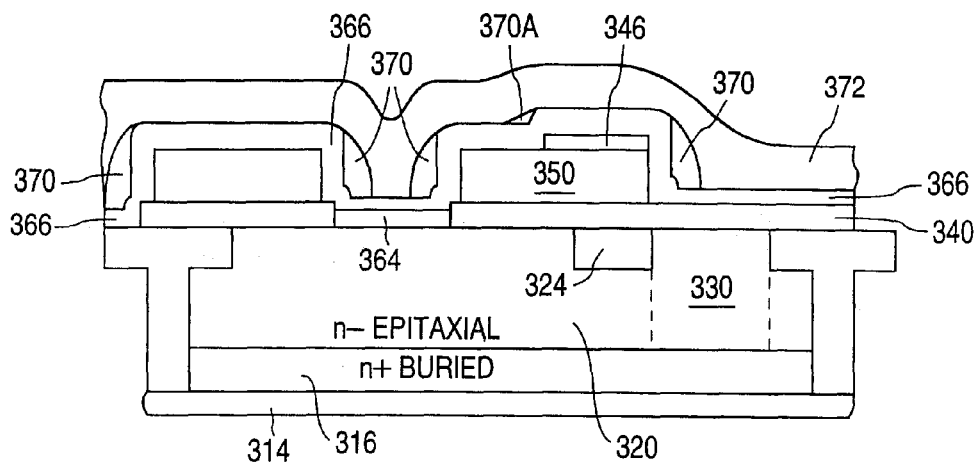
Figure 3F:
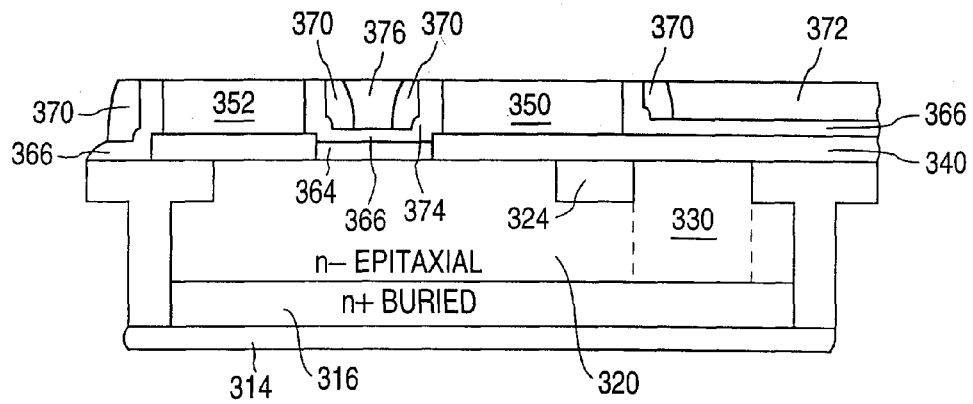
Figure 3G:
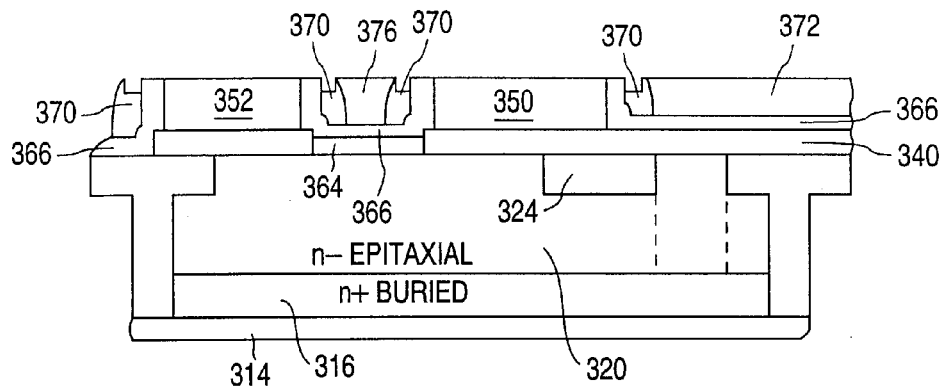
Figure 3H:
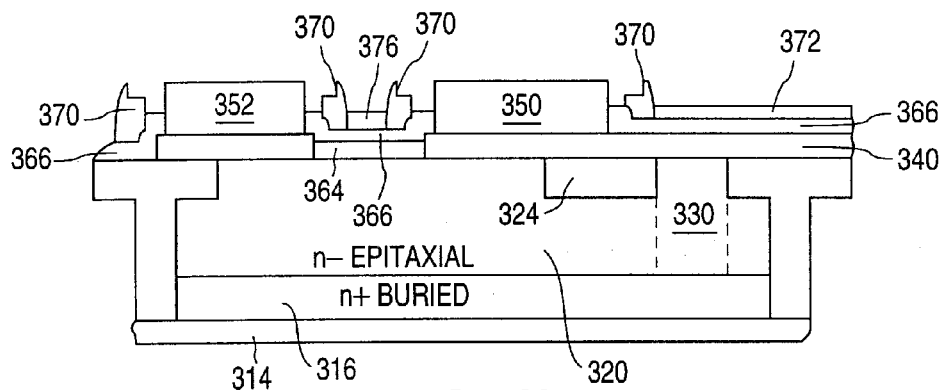
Figure 3I:
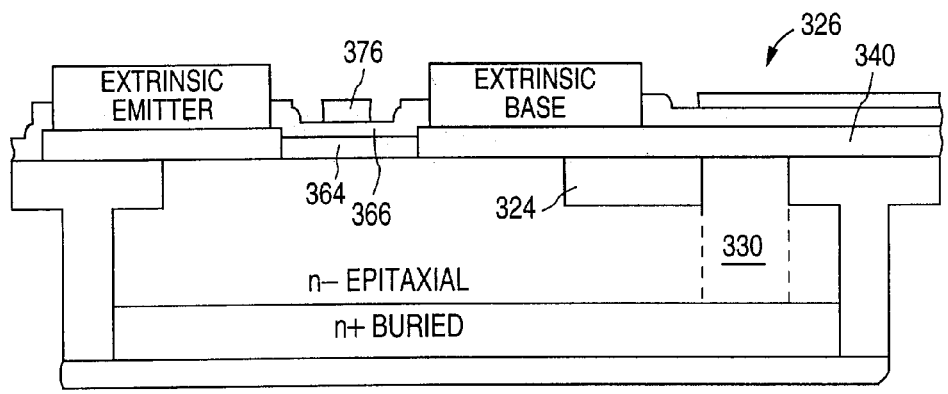
Figure 3J:
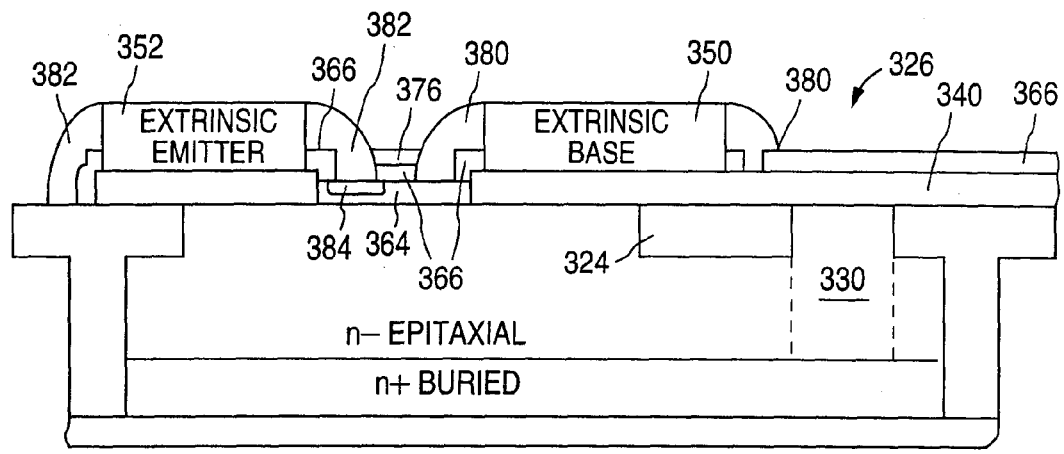
Figure 3K:
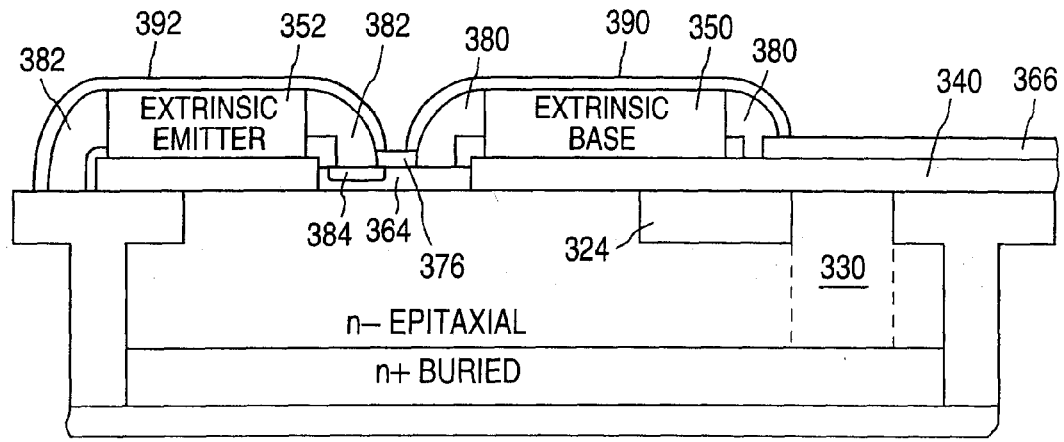

As shown in FIG. 3K, once the RTA process has been completed, a layer of silicide is formed over extrinsic base 350 and base poly spacer 380 to form a base contact 390, and over extrinsic emitter 352 and emitter poly spacer 382 to form an emitter contact 392. The method then continues with conventional steps.

Thus, a method for forming a bipolar transistor in accordance with the present invention has been described. The present method forms a small base region, an extrinsic base and emitter that are formed over an oxide, and small, self-aligned base and emitter contacts.

It should be understood that various alternatives to the method of the invention described herein may be employed in practicing the invention. For example, although the method is described with respect to npn transistors, the method applies equally well to pnp transistors where the conductivity types are reversed.

In addition, the present method can be incorporated into a BiCMOS process. Thus, it is intended that the following claims define the scope of the invention and that methods and structures within the scope of these claims and their equivalents be covered thereby.

What is claimed is:

1. A method for forming a bipolar transistor on a wafer, the wafer having a buried layer and a first epitaxial layer of a first conductivity type, the first epitaxial layer being formed over the buried layer and having a smaller dopant concentration than the buried layer, the method comprising the steps of:

forming a layer of isolation material on the first epitaxial layer;

forming an extrinsic base and an extrinsic emitter on the layer of isolation material, the extrinsic base having a second conductivity type and being spaced apart from the extrinsic emitter, the extrinsic emitter having the first conductivity type;

etching the layer of isolation material to form a first opening in the layer of isolation material, the first opening being between the extrinsic base and the extrinsic emitter, and exposing a surface of the first epitaxial layer;

forming an intrinsic base region on the surface of the first epitaxial layer in the first opening;

forming a first insulating spacer, a second insulating spacer, and an insulating plug on the intrinsic base region in the first opening, the first insulating spacer contacting the extrinsic base, the second insulating spacer being spaced apart from the first insulating spacer and contacting the extrinsic emitter, the insulating plug being spaced apart from the first and second insulating spacers, and formed between the first and second insulating spacers;

forming a base spacer that contacts the extrinsic base and the intrinsic base between the first insulating spacer and the insulating plug, and an emitter spacer that contacts the extrinsic emitter and the intrinsic base between the second insulating spacer and the insulating plug.

2. The method of claim 1 wherein the step of forming an extrinsic base and an extrinsic emitter includes the steps of:

forming a first layer of polysilicon on the layer of isolation material, the first layer of polysilicon having a base region and an emitter region;

doping the base region to have the second conductivity type, and the emitter region to have the first conductivity type; and etching the first layer of polysilicon to form the extrinsic base and the extrinsic emitter.

3. The method of claim 2 and further comprising the step of forming a first layer of insulation material on the first layer of polysilicon prior to etching the first layer of polysilicon.

4. The method of claim 3 and further comprising the step of forming a second layer of insulation material on the first layer of polysilicon and the first layer of insulation material prior to etching the layer of isolation material.

5. The method of claim 4 and further comprising the step of removing the first layer of insulation material from a side wall of the extrinsic base and the extrinsic emitter after etching the layer of isolation material and prior to the step of forming an instrinsic base.

6. The method of claim 1 wherein the step of forming an intrinsic base region includes the step of growing a second epitaxial layer of the second conductivity type on the surface of the first epitaxial layer in the first opening.

7. The method of claim 1 wherein the step of forming a first insulating spacer, a second insulating spacer, and an insulating plug includes the steps of:

forming a first layer of insulation material on the extrinsic base, the extrinsic emitter, the intrinsic base, and the layer of isolation material;

forming a first insulating region and a second insulating region on the first layer of insulation material over the intrinsic base region in the first opening, the first insulating region being adjacent to the extrinsic base, the second insulating region being spaced apart from the first insulating region, and adjacent to the extrinsic emitter, the first and second insulating regions defining a gap therebetween;

forming a second layer of insulation material on the first layer of insulation material and the first and second insulating regions to fill up the gap;

planarizing to remove the first layer of insulation material from over the extrinsic base and the extrinsic emitter, expose the first and second insulating regions, and define an insulation plug between the first and second insulating regions; and removing portions of the first layer of insulation material and the insulating plug, and the first and second insulating regions to expose a first area and a second area on the instrinsic base, the first and second areas being spaced apart.

8. The method of claim 7 wherein the step of removing portions of the first layer of insulation material includes the steps of:

etching away a portion of the first and second insulating regions to leave remaining portions;

etching away a portion of the first isolation material to expose a portion of the extrinsic base and the extrinsic emitter;

removing the remaining portions of the first and second insulating regions; and removing a portion of the first isolation material to expose the first area and the second area on the instrinsic base.

9. The method of claim 8 wherein the planarizing step is implemented with chemical-mechanical polishing.

10. The method of claim 1 and further comprising the step of heating the wafer after the base spacer and the emitter spacer have been formed.

11. The method of claim 10 wherein the step of forming an extrinsic base and an extrinsic emitter includes the steps of:

forming a first layer of polysilicon on the layer of isolation material, the first layer of polysilicon having a base region and an emitter region;

doping the base region to have the second conductivity type, and the emitter region to have the first conductivity type; and etching the first layer of polysilicon to form the extrinsic base and the extrinsic emitter.

12. The method of claim 11 and further comprising the step of forming a first layer of insulation material on the first layer of polysilicon prior to etching the first layer of polysilicon.

13. The method of claim 12 and further comprising the step of forming a second layer of insulation material on the first layer of polysilicon and the first layer of insulation material prior to etching the layer of isolation material.

14. The method of claim 13 and further comprising the step of removing the first layer of insulation material from a side wall of the extrinsic base and the extrinsic emitter after etching the layer of isolation material and prior to the step of forming an instrinsic base.

15. The method of claim 10 wherein the step of forming an intrinsic base region includes the step of growing a second epitaxial layer of the second conductivity type on the surface of the first epitaxial layer in the first opening.

16. The method of claim 10 wherein the step of forming a first insulating spacer, a second insulating spacer, and an insulating plug includes the steps of:
   forming a first layer of insulation material on the extrinsic base, the extrinsic emitter, the intrinsic base, and the layer of isolation material;
   forming a first insulating region and a second insulating region on the first layer of insulation material over the intrinsic base region in the first opening, the first insulating region being adjacent to the extrinsic base, the second insulating region being spaced apart from the first insulating region, and adjacent to the extrinsic emitter, the first and second insulating regions defining a gap therebetween;
   forming a second layer of insulation material on the first layer of insulation material and the first and second insulating regions to fill up the gap;
   planarizing to remove the first layer of insulation material from over the extrinsic base and the extrinsic emitter, expose the first and second insulating regions, and define an insulation plug between the first and second insulating regions; and
   removing portions of the first layer of insulation material and the insulating plug, and the first and second insulating regions to expose a first area and a second area on the instrinsic base, the first and second areas being spaced apart.

17. The method of claim 16 wherein the step of removing portions of the first layer of insulation material includes the steps of:
   etching away a portion of the first and second insulating regions to leave remaining portions;
   etching away a portion of the first isolation material to expose a portion of the extrinsic base and the extrinsic emitter;
   removing the remaining portions of the first and second insulating regions; and
   removing a portion of the first isolation material to expose the first area and the second area on the instrinsic base.

18. The method of claim 17 wherein the planarizing step is implemented with chemical-mechanical polishing.

19. A bipolar transistor formed on a wafer, the wafer having a buried layer and a first epitaxial layer of a first conductivity type, the first epitaxial layer being formed over the buried layer and having a surface and a smaller dopant concentration than the buried layer, the transistor comprising:
   an intrinsic base region of a second conductivity type formed on the surface of the first epitaxial layer in the opening;
   a layer of isolation material formed on the surface of the first epitaxial layer to adjoin the intrinsic base region;
   a first spacer formed on the layer of isolation material and the intrinsic base region;
   a second spacer formed on the layer of isolation material and the intrinsic base region, the second spacer being spaced apart from the first spacer;
   an extrinsic base formed on the layer of isolation material;
   an intrinsic emitter region formed in the intrinsic base region; and
   an extrinsic emitter formed on the layer of isolation material;
   a first conductive spacer formed on the first isolating spacer to contact the extrinsic base and the intrinsic base region; and
   a second conductive spacer formed on the second isolating spacer to contact the extrinsic emitter and the intrinsic emitter region of the intrinsic base region, the second conductive spacer being spaced apart from the first conductive spacer.

* * * * *

UNITED STATES PATENT AND TRADEMARK OFFICE
CERTIFICATE OF CORRECTION

PATENT NO. : 6,380,017 B1
DATED : April 30, 2002
INVENTOR(S) : Darwish et al.

It is certified that error appears in the above-identified patent and that said Letters Patent is hereby corrected as shown below:

<u>Drawings,</u>
Please delete sheets Figures 1-3K and insert replacement drawing sheets Figures 1-3K.

Signed and Sealed this

Sixth Day of August, 2002

Attest:

JAMES E. ROGAN
Attesting Officer  Director of the United States Patent and Trademark Office